(12) United States Patent
Bockelman et al.

(10) Patent No.: US 7,872,528 B2
(45) Date of Patent: Jan. 18, 2011

(54) PROVIDING PRE-DISTORTION TO AN INPUT SIGNAL

(75) Inventors: David E. Bockelman, Dripping Springs, TX (US); Vishnu Srinivasan, Austin, TX (US)

(73) Assignee: Javelin Semiconductor, Inc., Austin, TX (US)

( * ) Notice: Subject to any disclaimer, the term of this patent is extended or adjusted under 35 U.S.C. 154(b) by 239 days.

(21) Appl. No.: 12/082,311

(22) Filed: Apr. 10, 2008

(65) Prior Publication Data

US 2009/0256631 A1  Oct. 15, 2009

(51) Int. Cl.
*H03F 1/26* (2006.01)
(52) U.S. Cl. .................. 330/149; 330/124 R; 330/165
(58) Field of Classification Search .............. 330/149, 330/124 R, 165
See application file for complete search history.

(56) References Cited

U.S. PATENT DOCUMENTS

| | | | |
|---|---|---|---|
| 4,580,111 A | 4/1986 | Swanson | |
| 4,593,251 A | 6/1986 | Smith | |
| 4,680,559 A | 7/1987 | Swanson | |
| 5,424,680 A | 6/1995 | Nazarathy et al. | |
| 5,495,166 A | 2/1996 | Alini et al. | |
| 5,872,481 A | 2/1999 | Sevic et al. | |
| 6,055,278 A | 4/2000 | Ho et al. | |
| 6,069,525 A | 5/2000 | Sevic et al. | |
| 6,566,948 B1 | 5/2003 | Braithwaite et al. | |
| 6,570,430 B1 * | 5/2003 | Zhou | 327/317 |
| 6,724,253 B2 * | 4/2004 | Hau et al. | 330/149 |
| 6,731,166 B1 | 5/2004 | Sabouri et al. | |
| 6,774,719 B1 | 8/2004 | Wessel et al. | |
| 6,809,587 B2 * | 10/2004 | Ghannouchi et al. | 330/149 |
| 6,828,858 B2 | 12/2004 | Larson et al. | |
| 6,885,239 B2 | 4/2005 | Otaka | |
| 6,996,379 B2 | 2/2006 | Khorram | |
| 7,095,283 B2 | 8/2006 | Kee et al. | |
| 7,129,784 B2 | 10/2006 | Bhatti et al. | |
| 7,157,965 B1 | 1/2007 | Kim | |
| 7,202,736 B1 * | 4/2007 | Dow et al. | 330/129 |
| 7,215,206 B2 | 5/2007 | Dupuis et al. | |
| 7,332,961 B2 * | 2/2008 | Blednov | 330/149 |
| 7,385,447 B1 * | 6/2008 | Adar | 330/149 |
| 7,425,871 B2 * | 9/2008 | Gao et al. | 330/289 |
| 2006/0267689 A1 | 11/2006 | Elmala et al. | |
| 2008/0031382 A1 | 2/2008 | Aoki | |

OTHER PUBLICATIONS

U.S. Appl. No. 12/080,066, filed Mar. 31, 2008, Entitled "Compensating for Non-Linear Capacitance Effects in a Power Amplifier," by David E. Bockelman, et al.

RF Micro Devices, Inc., "RF2173, 3V GSM Power Amplifier, Package Style: QFN, 16-Pin, 4×4," 2006, pp. 1-14.

(Continued)

*Primary Examiner*—Patricia Nguyen
(74) *Attorney, Agent, or Firm*—Trop, Pruner & Hu, P.C.

(57) ABSTRACT

In one implementation, the present invention includes a diode device to receive an incoming radio frequency (RF) signal to be amplified in a gain device of an amplifier and to provide a pre-distorted signal. Based on this pre-distorted signal, the gain device can output an amplified RF signal having substantial linearity to the incoming RF signal.

18 Claims, 14 Drawing Sheets

OTHER PUBLICATIONS

RF Micro Devices, Inc., "What's Next In UMTS Front-Ends," 2007, pp. 1-2.

Anadigics, "AWT6278R, HELP3™ PCS/WCDMA 3.4 V/29.5 dBm, Linear Power Amplifier Module, Data Sheet—Rev. 2.0," Jan. 2007, pp. 1-8.

International Search Report of PCT/US2009/036473, dated Sep. 28, 2009.

International Search Report and Written Opinion of PCT/US2009/036465, dated Sep. 22, 2009.

Chengzhou Wang, et al., "A Nonlinear Capacitance Technique and its Application to a CMOS Power Amplifier," 2001, pp. 1-4.

* cited by examiner

PROVIDING PRE-DISTORTION TO AN INPUT SIGNAL

BACKGROUND

Devices that form gain stages of a power amplifier (PA) or other similar circuitry are inherently non-linear. Operating such a device in Class A operation in which the device is always in the conducting state may reduce non-linearity effects, but such operation is to be avoided, as a large bias current is needed to make the signal current small compared to the bias current. As a result, it becomes impractical to power the PA in a low power application. Efforts have been made to linearize these devices over a large range of currents, such that as input or signal currents vary over several orders of magnitude, a degree of linearity can be maintained between input to output with a small DC current. However, while a sub-micron complementary metal oxide semiconductor (CMOS) device has a very linear transconductance over some of its bias range due to short channel effects, high efficiency gain stages formed of CMOS devices can suffer from significant gain expansion. This is because stages biased in Class B or AB for high efficiency operate in a sub-threshold region for some portion of their power transfer characteristic. Sub-threshold conduction is an exponential process, and causes significant gain expansion.

Current approaches to solve this problem act to increase the quiescent current in each stage until there is sufficient linearity. However, this does not completely compensate for the non-linearity, and further it consumes significant power. Other approaches that rely on feedback or feed-forward linearization to provide a correction at an output of a gain stage consume significant power, are difficult to implement in portable products, and suffer from stability problems.

SUMMARY OF THE INVENTION

In one aspect, the present invention includes an apparatus having a diode device to receive an incoming radio frequency (RF) signal to be amplified in a gain device of an amplifier and to provide a pre-distorted signal. In turn, the gain device is coupled to receive the pre-distorted signal and to output an amplified RF signal. The diode device acts to pre-distort the input signal with an inverse distortion of a non-linearity of the gain device such that the amplified RF signal is a substantially linear version of the incoming RF signal. In one such implementation, the diode device is a diode-connected transistor having a common polarity with the gain device. In some implementations, a helper circuit can be coupled to the diode device to compensate for a leakage current of the diode, the driver stage, or the gain device.

Another aspect of the present invention is directed to a power amplifier having multiple driver stages to receive a RF signal and provide RF driver signals, and multiple complementary pairs of diode devices coupled to the driver stages to pre-distort the RF driver signals into pairs of pre-distortion signals to compensate for non-linearity of corresponding gain stages. Each gain stage may include a complementary amplifier to receive the pre-distortion signals and to output an amplified RF signal. Using these multiple gain stages and diode device pairs, parallel signal paths can be formed. Such a power amplifier may be implemented in a wireless system to amplify signals provided by a transceiver or other such circuitry to an appropriate level for transmission via an antenna or other radiation means.

Yet another aspect of the present invention is directed to an apparatus including a pre-distortion diode to receive an input current along a signal path and generate a pre-distorted voltage, a helper circuit coupled to the signal path to provide any diverted currents, and a gain device to receive the pre-distortion voltage and to generate an output current. In another implementation, the helper circuit can instead by configured as a cascode device coupled to the signal path to receive the input current and pass it to its output, which is in turn coupled to the pre-distortion diode.

A still further aspect of the present invention is directed to a power amplifier that has parallel gain stages each to receive an input current and generate an amplified output current that is provided to a load to generate an amplified voltage. Each parallel gain stage may include a pre-distortion diode to generate a pre-distortion voltage, a filter coupled to the pre-distortion diode and tuned to a fundamental or a harmonic frequency, and a gain device driven by the pre-distortion voltage to generate the amplified output current. By providing such parallel gain stages, harmonics can be reduced.

DETAILED DESCRIPTION

In many amplifiers such as in a PA, an output device is a transconductance amplifier, in which a voltage is input to the device and current is output from the device. As described above, this device is typically non-linear. To reduce the non-linearity in various embodiments, a similar device can be provided having an inverse function by driving it with a current and outputting a voltage. Essentially, the same device is used to solve its own non-linearity. More specifically, by configuring a similar transconductor amplifier as a diode, an inverse function is provided in which this diode is driven with a current that creates a pre-warped or pre-distorted voltage. That voltage then drives the main non-linear device (i.e., output device) and its non-linear function is inverted or cancelled by this pre-distortion, such that a substantially linear output current is obtained. In other words, a linear current is input and a linear current is output from such a compensated circuit.

Although different implementations are possible, some applications may include a diode device coupled in shunt with an input terminal of a gain element. For example, a PA having a transconductance amplifier, e.g., formed of a common-source CMOS amplifier, may have a shunt device coupled to its gate terminal. Embodiments may provide this diode which acts to linearize the gain expansion by compressing the gate voltage ($V_g$) with an inverse function.

Figure 1:
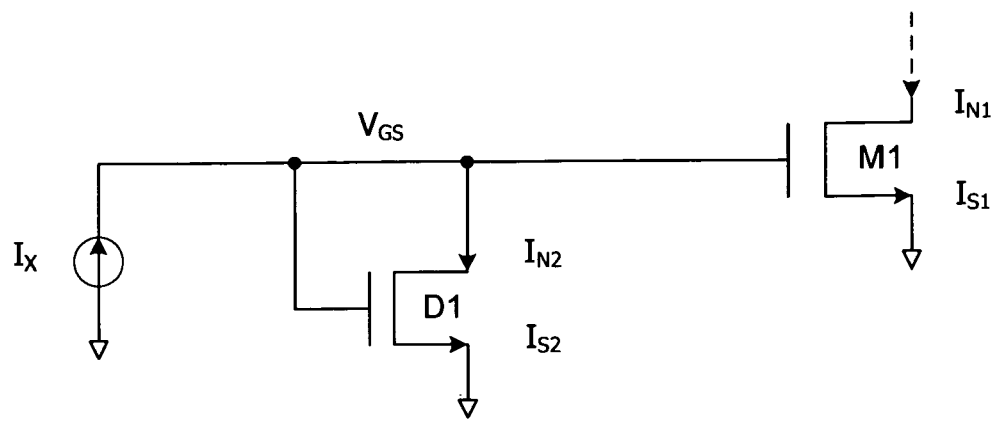
FIG. 1 is a schematic diagram of a circuit in accordance with one embodiment of the present invention.

Referring now to FIG. 1, shown is a schematic diagram of a circuit in accordance with one embodiment of the present invention. As shown in FIG. 1, circuit 10 may be a part of a gain stage of a power amplifier, e.g., a CMOS power amplifier. Specifically, a first metal oxide semiconductor field effect transistor (MOSFET), specifically an n-channel MOSFET (NMOS) M1 may act as a common-source amplifier to amplify an incoming signal at a gate terminal to thus provide an amplified output signal at a drain terminal having a current value of $I_{N1}$ and a saturation current $I_{S1}$, and which can be represented having an area A1. The input voltage, which may correspond to a gate-to-source voltage ($V_{GS}$) may be received from an input stage (represented in FIG. 1 as a current source $I_x$). Understand that in various embodiments, this input stage may be a driver stage at a front end of a PA, a front end gain stage in the case of cascaded gain stages, or an input to a PA.

Still referring to FIG. 1, to provide for improved linearity of MOSFET M1, a diode device, namely a second MOSFET D1, which may also be another NMOS transistor is coupled in shunt to the gate terminal of MOSFET M1. This diode-connected transistor thus has its gate and drain terminals coupled to the gate terminal of MOSFET M1, and a source terminal coupled in common with the source terminal of MOSFET M1 to a reference voltage (e.g., a ground voltage). Note that MOSFET D1 has current flow of $I_{N2}$ associated with it, and a corresponding saturation current $I_{S2}$, and an area of A2, where the ratio of areas A1/A2 is the current gain. While shown with this particular implementation in the embodiment of FIG. 1, understand that various other configurations of a diode pre-distortion circuit may be realized in other embodiments.

With regard to circuit 10, neglecting AC current flow in capacitances of the circuit at sub-threshold levels, $IN_2 = I_{S2} e^{V_{GS}/nV_T} = I_x$ where $V_T$ is the threshold voltage of the gain device and Is2 is the saturation current of the diode D2.

Thus $V_{GS} = nV_T \ln(I_x/I_{S2})$. In turn, $I_{N1} = I_{S1} e^{V_{GS}/nV_T} = I_{S1}$ exp $$\left[\frac{nV_t \ln(I_x/I_{S2})}{nV_t}\right] = \frac{I_{S1}}{I_{S2}} I_x.$$

Note that the ratio of $I_{S1}/I_{S2}$ is equal to the ratio of the area of the devices, and corresponds to an effective "current gain", $\beta_E$, where $\beta_E$ thus can be controlled by a ratio of the areas of the two devices. The DC current (quiescent) equals $I_{Q1}+I_{Q2}$. By making the area of the diode device relatively small with respect to the size of the gain device, the total DC current required for a given linearity can be reduced with respect to the Class AB quiescent current of a CMOS gain stage.

Figure 2A:
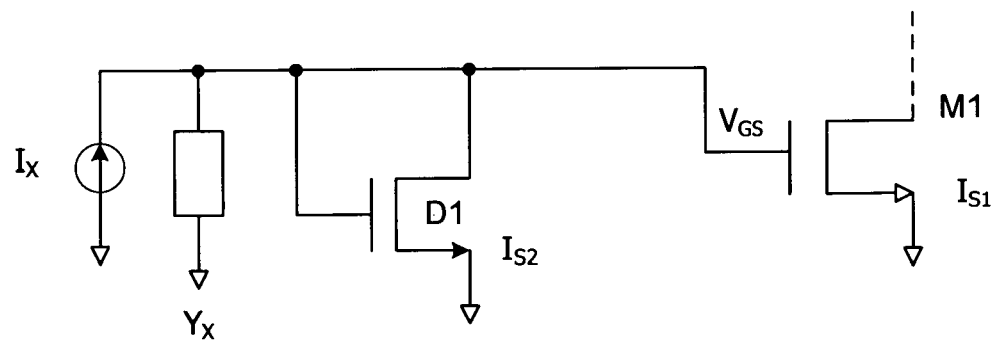
FIG. 2A is another schematic diagram of a circuit in accordance with one embodiment of the present invention.

Consider now a driver stage output impedance of a driver stage at a front end of the gain stage and a gate capacitance of the gain device. Referring now to FIG. 2A, shown is another schematic of the circuit of FIG. 1 that further details the impedance and gate capacitance of a driver stage coupled to an input of the gain stage. Thus as shown in FIG. 2A, circuit 10 includes the same MOSFETs M1 and D1 from FIG. 1. In addition, a driver stage coupled to the input is shown modeled as an impedance $Y_X$ that corresponds to a combined driver output and gate impedance which is coupled in parallel with the current source $I_x$ and MOSFETs M1 and D1. Thus in this model, $I_x = Y_X \cdot V_{GS} + I_{S2} e^{V_{GS}/nV_T}$.

$V_{GS}$ in closed form cannot be solved. The main effect of $Y_X$ is to limit the effectiveness of the gate voltage pre-distortion provided by the diode. Thus, the conductance (admittance) should be minimized for greatest linearization.

Essentially, with reference to FIG. 2A, the gain stage is driven by another stage that has non-ideal elements associated with it, i.e., elements that are meaningful at RF, such as input capacitances, driver output impedances and so forth. Thus a tuned circuit such as in the form of an inductor may be included to resonate at a particular frequency, e.g., at a fundamental frequency. In various embodiments, such an inductor can be implemented with a transformer having a center tap bias feed, or a single inductance with an AC coupling capacitance.

Figure 2B:
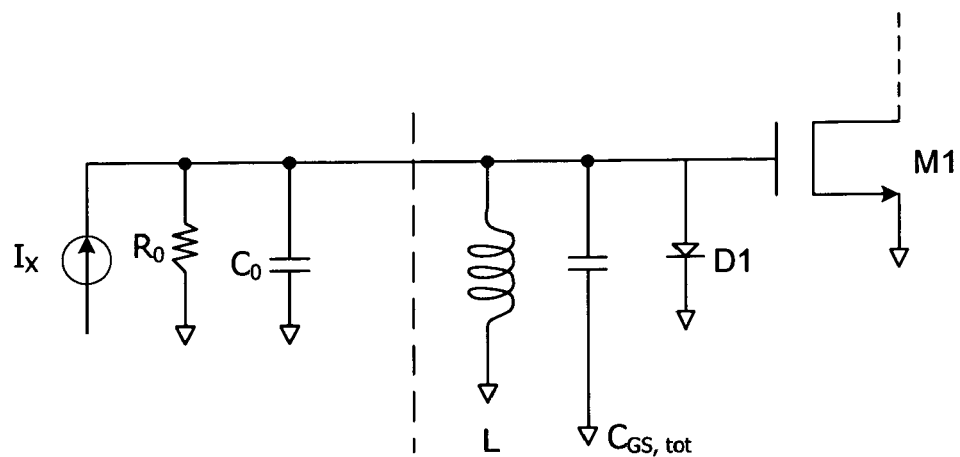
FIG. 2B is yet another schematic diagram of a circuit in accordance with one embodiment of the present invention.

Various manners of reducing Yx, which may improve the linearization realized by pre-distortion, may be implemented in different embodiments. Referring now to FIG. 2B, shown is another representation of circuit 10. Note that a capacitance $C_{gs,TOT}$, is in parallel with diode D1, which represents the total capacitance from the gate to source of the gain stage, including diode D1's gate and drain capacitances. In turn, the driver stage is represented with a resistance $R_O$ and $C_O$. An inductance, L, may be provided in parallel with these devices to thus resonate at a frequency corresponding to the combined capacitance of $C_O$ and $C_{gs,TOT}$. Accordingly, within the bandwidth of the resonant/tuned circuit, only the output resistance $R_O$ of the driver remains. This simplified model of a gain stage incorporating pre-distortion techniques in accordance with an embodiment of the present invention may be implemented in a variety of manners.

Still referring to the model of FIG. 2B, inductor L essentially resonates out these capacitances and only lossy elements (e.g., resistance) remain. For translinear operation, ignoring the resonant structure formed of the capacitance and inductance that acts as a filter, a single input tone into the pre-distortion diodes generates voltage harmonics at the input node to the gain device. Such harmonics combine through the non-linear transconductance and cancel out the harmonics at the output and thus a single tone is obtained at the output.

However, because of the filtering of at least some harmonics at the gate node, circuit operation is no longer exactly translinear. But in a large signal operation, even though harmonics are filtered, a significant linearization of the fundamental input to fundamental output is realized, which provides a benefit in large signal operation.

An ideal implementation of diode pre-distortion would attempt to negate this capacitance. In narrowband RF operation, capacitance negation can be realized with such an inductor, which however impacts the harmonics, and therefore the quality of pre-distortion. However at a fundamental frequency which is within such narrowband operation, the linearity relationship between the output and the input at the fundamental frequency is enhanced by this technique.

Note that the compensation is referred to as diode pre-distortion, because at RF levels, there is not a pure translinear circuit, because of filtering provided by the inductance, which takes it out of the translinear domain. Even in implementations in which a deliberate bandpass filter is not provided with an inductance, low pass filtering still occurs because of the nature of the capacitance inherent in the gate of the gain device. In this case, at sufficiently low operating frequency, the low pass filter effect is negligible, and as such the circuit is approximately translinear.

Because of the filtering, the harmonic cancellation at the output is not complete. There will be some level of harmonics at the output, thus the circuit is weakly non-linear. Other implementations may provide for harmonic cancellation, as will be described further below.

Figure 3A:
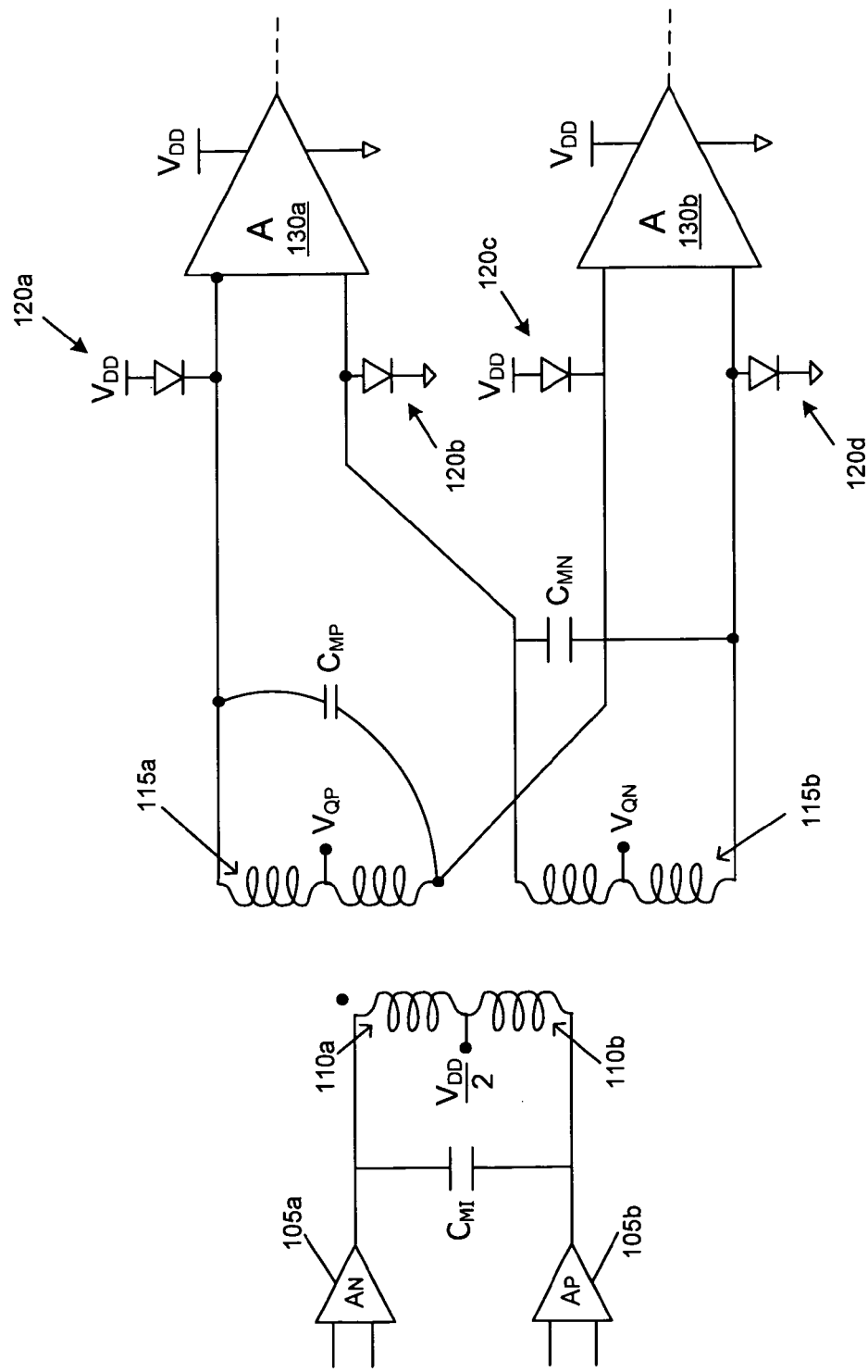
FIG. 3A is a schematic diagram of a differential implementation of a portion of an amplifier in accordance with one embodiment of the present invention.

Referring now to FIG. 3A, shown is a schematic diagram of a differential implementation of a portion of a PA in accordance with one embodiment of the present invention. As shown in FIG. 3A, PA 100 includes a driver stage formed of a differential pair of drivers $105_a$ and $105_b$, each of which is coupled to receive a corresponding positive or negative portion of an incoming signal. Driver stage 105 (generically) may be formed of various PMOS and NMOS devices. The outputs of driver stages 105 may be coupled to a three winding transformer, namely a transformer formed of a primary coil 110 and secondary coils $115_a$ and $115_b$. Note that a matching capacitance, $C_{MT}$, is coupled in parallel between the outputs of driver stages $105_a$ and $105_b$. Furthermore, note that primary coil 110 may be center tapped with a bias voltage, which may correspond to half of a supply voltage, e.g., $V_{DD}/2$, or some other voltage as is appropriate to the implementation of the driver stages.

Referring still to FIG. 3A, note that the secondary coils $115_a$ and $115_b$ may be center tapped with a bias voltage (respectively bias voltages $V_{OP}$ and $V_{ON}$). As shown in FIG. 3A, secondary coils $115_a$ and $115_b$ are cross-coupled to gain stages $130_a$ and $130_b$, each of which may include a complementary amplifier, e.g., formed of an NMOS and PMOS device having output terminals coupled together. As shown in FIG. 3A, diode-pre-distortion may be provided by a plurality of diodes $120_a$-$120_d$, coupled in parallel to the input lines to gain stages $130_a$ and $130_b$. As described above, in one embodiment each diode may be a forward-biased diode-connected transistor, e.g., a MOSFET of the same polarity as the corresponding MOSFET device of the gain stages to which it is coupled. Note that the pre-distortion diodes are forward-biased and are in the signal path. Thus rather than using diodes for a bias network at baseband levels, embodiments thus provide a linearity improvement at RF levels using the pre-distortion realized by forward-biased diodes, while still maintaining a narrowband filter at the gate node of the output device. As further shown, capacitance matching for the transformer may be provided by a pair of capacitances $C_{MP}$ and $C_{MN}$, coupled in parallel to the cross-coupled input lines.

Note that in some implementations, the area ratio of the diode devices (shown as diodes $120_a$ and $120_b$) in FIG. 3A can be nominally equal to the area ratio of PMOS/NMOS devices in the main gain stages. The ratio of the diode area to the driver area can be used to set the current gain. The total capacitance on the gates of the gain devices, including that of the associated diodes, is part of the matching capacitance, so that $C_{MP}$ can be small (or zero). In implementations having parallel gain stages to provide for varying power levels of operation, for example, a stage can be turned off by setting bias voltages $V_{OP}=V_{DD}$ and $V_{ON}=0$ so that no current flows through the diodes.

As shown in FIG. 3A, for example, diode $120_a$, which may be a PMOS diode is coupled to a supply voltage, and diode $120_b$, which may be an NMOS diode is coupled to a reference potential. Similarly, diode $120_a$ may be coupled to the input of a PMOS device of gain stage $130_a$ and diode $120_b$ coupled to the input of an NMOS device of gain stage $130_a$. Note that the embodiment shown in FIG. 3A is an implementation in which an inductance to thus substantially cancel out parasitic capacitances at a center frequency is realized using a transformer. However, as mentioned above in other implementations, a single inductor with an AC coupling capacitor may also be used to provide the inductance to thus cancel out undesired capacitances. While shown with this particular implementation in the embodiment of FIG. 3A, the scope of the present invention is not limited in this regard, and other configurations, both differential and single-ended are possible. Furthermore, it is understood that parallel gain stages may be provided to enable controllable powering of such stages for low power and high power operation.

Figure 3B:
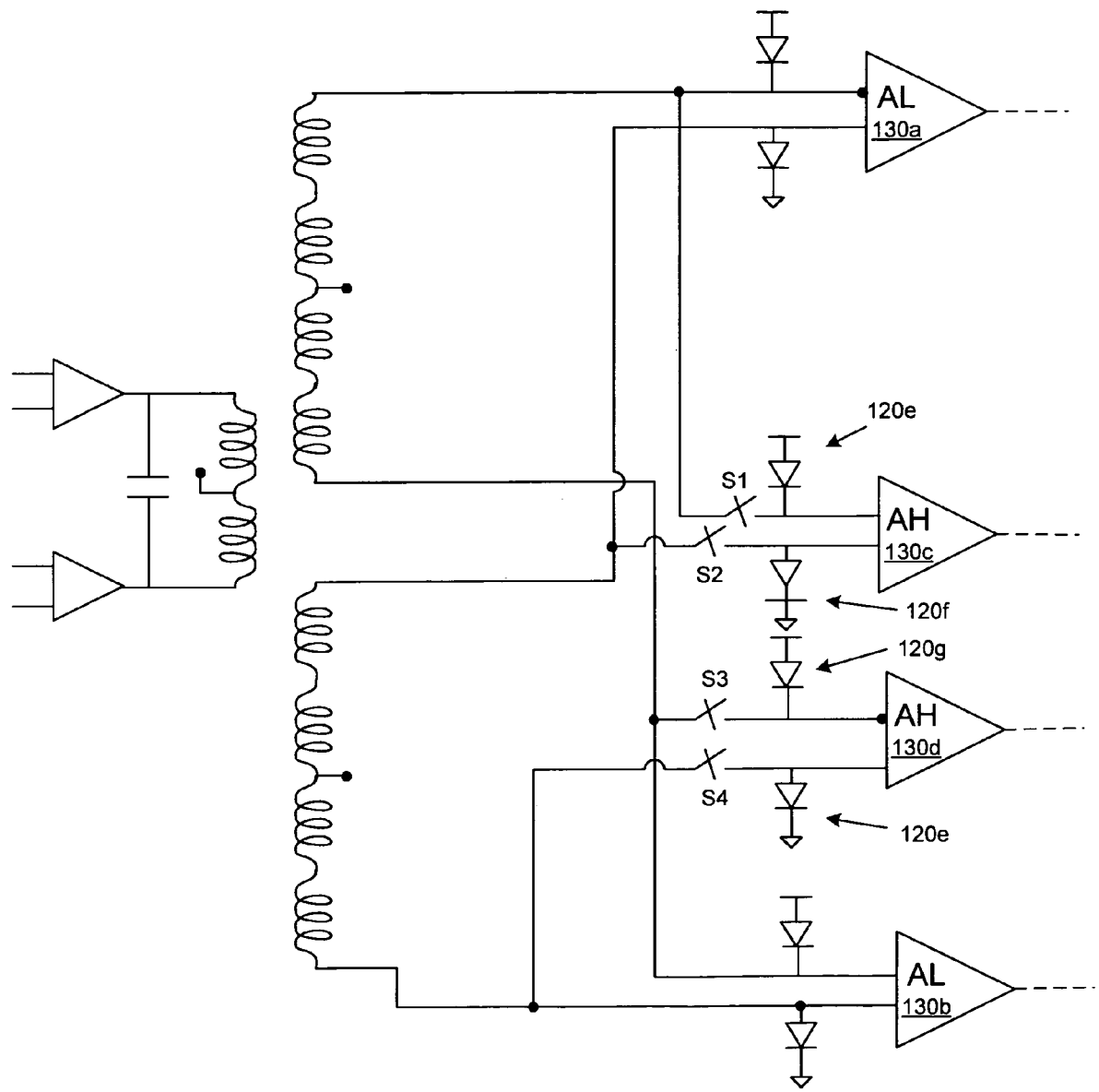
FIG. 3B is a schematic diagram of another implementation in which parallel gain stages may be provided.

Referring now to FIG. 3B, shown is another implementation in which parallel gain stages may be provided to enable operation in high and low power modes. Specifically, in addition to gain stages $130_a$ and $130_b$, additional gain stages $130_c$ and $130_d$ are also present. Each of these additional gain stages, which may correspond to high power gain stages, may be switchably coupled to receive incoming signals in a high power mode of operation. As with gain stages $130_a$ and $130_b$, multiple pre-distortion diodes $120_e$-$120_h$ may be each input line into gain stages $130_c$ and $130_d$. Thus when controlled to be switched in by switches S1-S4, these two additional gain stages may be powered on. Further, understand that FIG. 3B is simplified in that matching capacitances and other components are not shown for ease of illustration. Further note that embodiments can include more than two gain paths if additional modes, such as output power levels, are desired. Also, there are many similarly effective means by which the signal can be distributed to the various gain stages, and there are similarly many means by which to disable one or more gain stages.

Figure 4A:
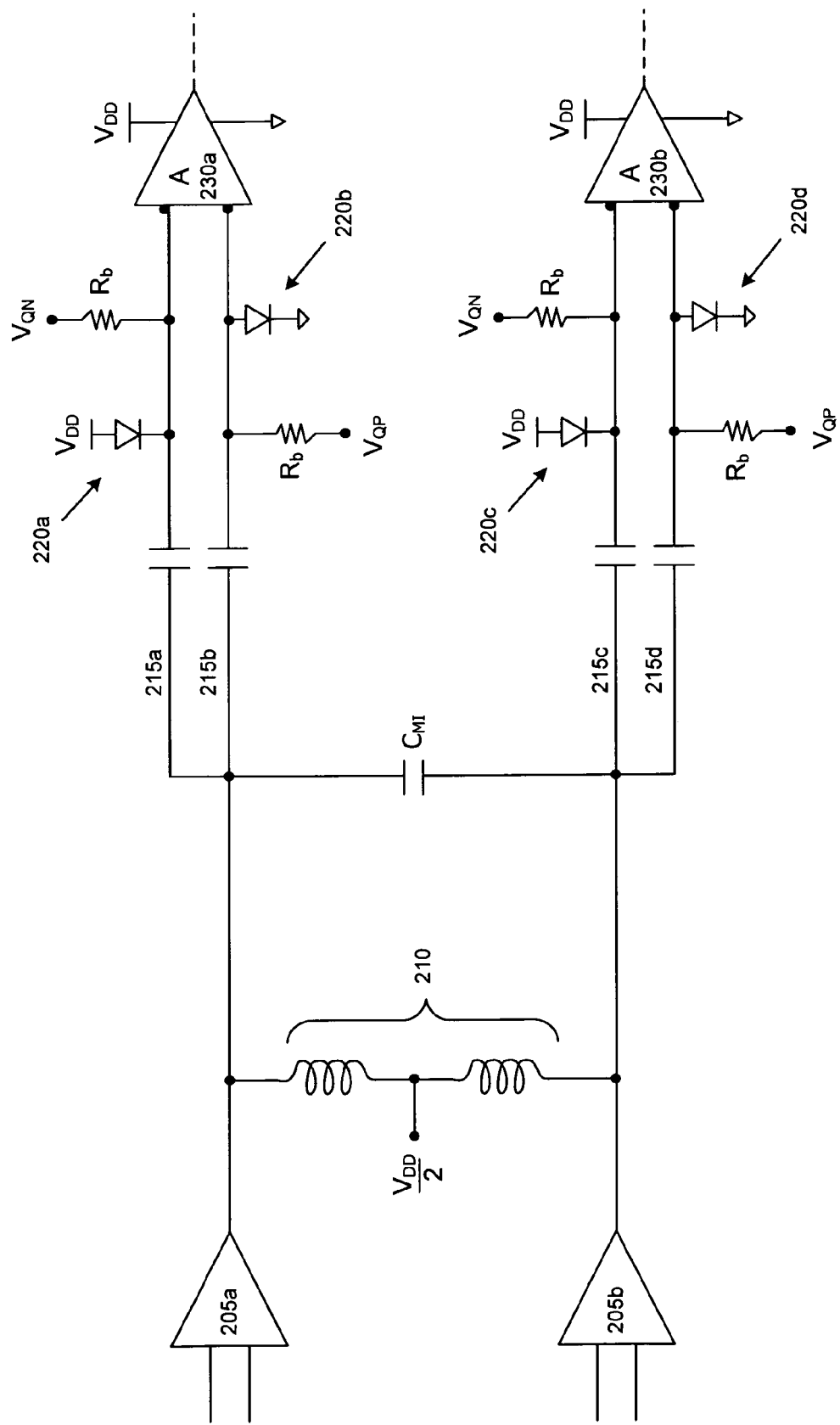
FIG. 4A is a schematic diagram of a signal path of an amplifier in accordance with another embodiment of the present invention.

Referring now to FIG. 4A, shown is a schematic diagram of a circuit in accordance with another embodiment of the present invention. Specifically, as shown in FIG. 4A, circuit 200 may be similar to that described above regarding circuit 100 in FIG. 3A. Namely driver stages $205_a$ and $205_b$ are present, outputs of which are coupled to gain stages $230_a$ and $230_b$. However, rather than the transformer present in FIG. 3A, a single inductance, represented as an inductor 210, is provided in parallel between the outputs of driver stages $205_a$ and $205_b$. Note that in the embodiment of FIG. 4A, this inductance may be center tapped with a bias voltage of approximately half of a supply voltage, or other appropriate value. Furthermore, in addition to a parallel matching capacitance $C_{MT}$, AC coupling capacitances $215_a$-$215_d$ are serially provided on the input lines to gain stages $230_a$ and $230_b$ to thus provide AC coupling of the input signal. In other respects, circuit 200 of FIG. 4A may be substantially similar to that of circuit 100 of FIG. 3A. Note that in the embodiment of FIG. 4A, bias voltages for gain stages 130$_a$ and 130$_b$ may be provided through resistors Rb coupled to the input signal lines to gain stages 230$_a$ and 230$_b$. Note that pre-distortion diodes 220$_a$-220$_d$ may be relatively small, and so that when they are biased at the same bias level as the device, some current is drawn. Thus the bias resistors can be made large enough so that at an RF impedance scale, the bias voltage may be adjusted to account for the drop across the resistor. While shown with this particular implementation in the embodiment of FIG. 4A, the scope of the present invention is not limited in this regard.

In the implementation of FIG. 4A, device considerations may be as above. Note further in this embodiment, diode capacitances add to gate capacitances and output capacitances from the drivers and should be considered in matching, where the values of the inductance and $C_{MI}$ are selected for matching. In one implementation, $C_{MI}$ may be omitted if the inductance is adjusted for matching. The values of the AC coupling capacitances (e.g., capacitors 215$_a$ and 215$_b$) can be selected for gain—non-linear capacitance variation trade-off. Larger capacitance values for these capacitors leads to higher gain but can also lead to a higher change in gate capacitance.

Figure 4B:
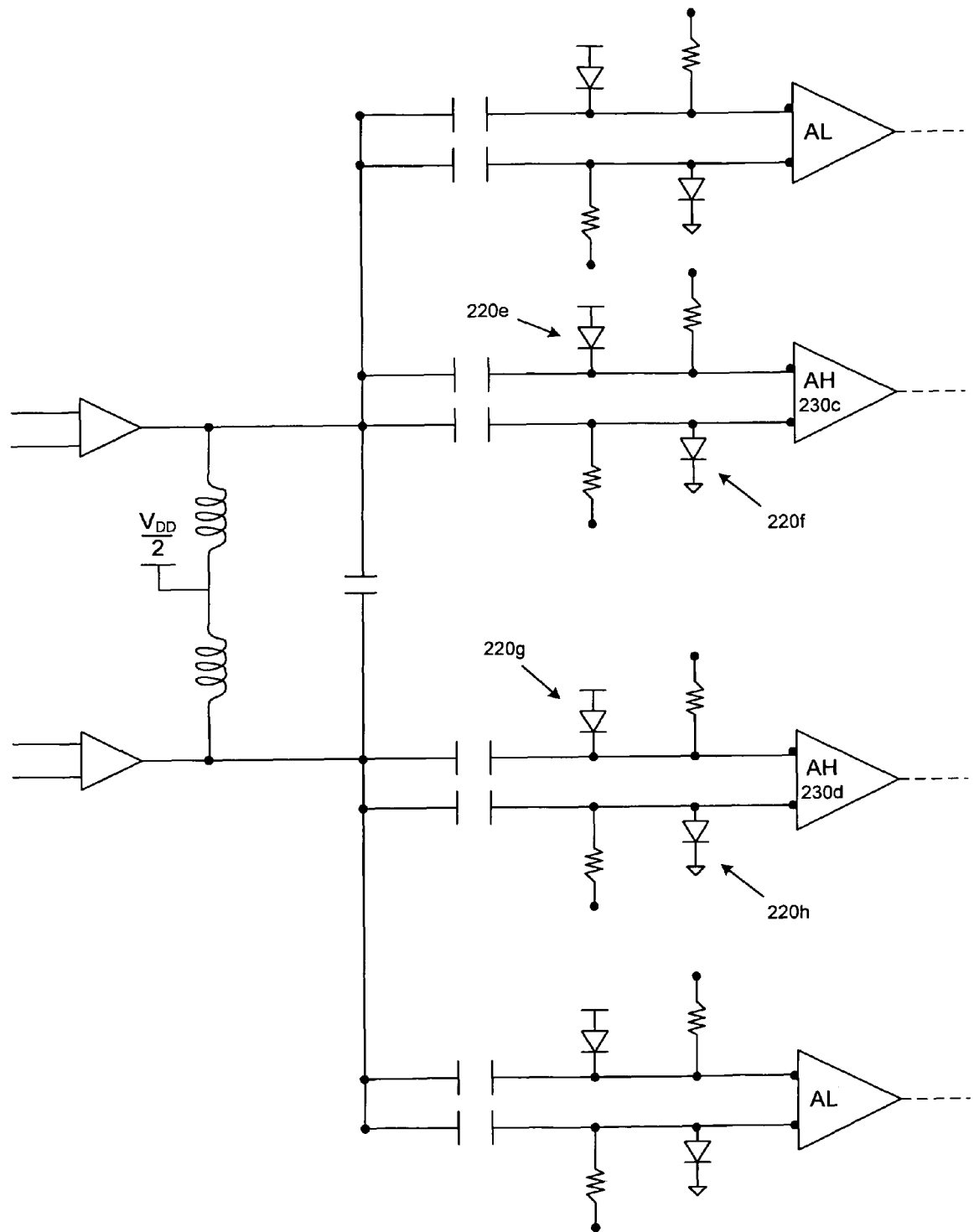
FIG. 4B is a schematic diagram of an implementation in which parallel gain stages may be provided.

Referring now to FIG. 4B, shown is an implementation of parallel paths of gain stages using a differential AC-coupled implementation. As shown in FIG. 4B, circuit 200' may be similar to that of circuit 200 of FIG. 4A with the addition of parallel differential gain stages 230$_c$ and 230$_d$, which may be high power gain stages to be operated during high power operation. As with circuit 200 of FIG. 4A, pre-distortion diodes 220$_e$-220$_h$ may be coupled to the input lines to the gain stages to provide diode pre-distortion.

Figure 5:
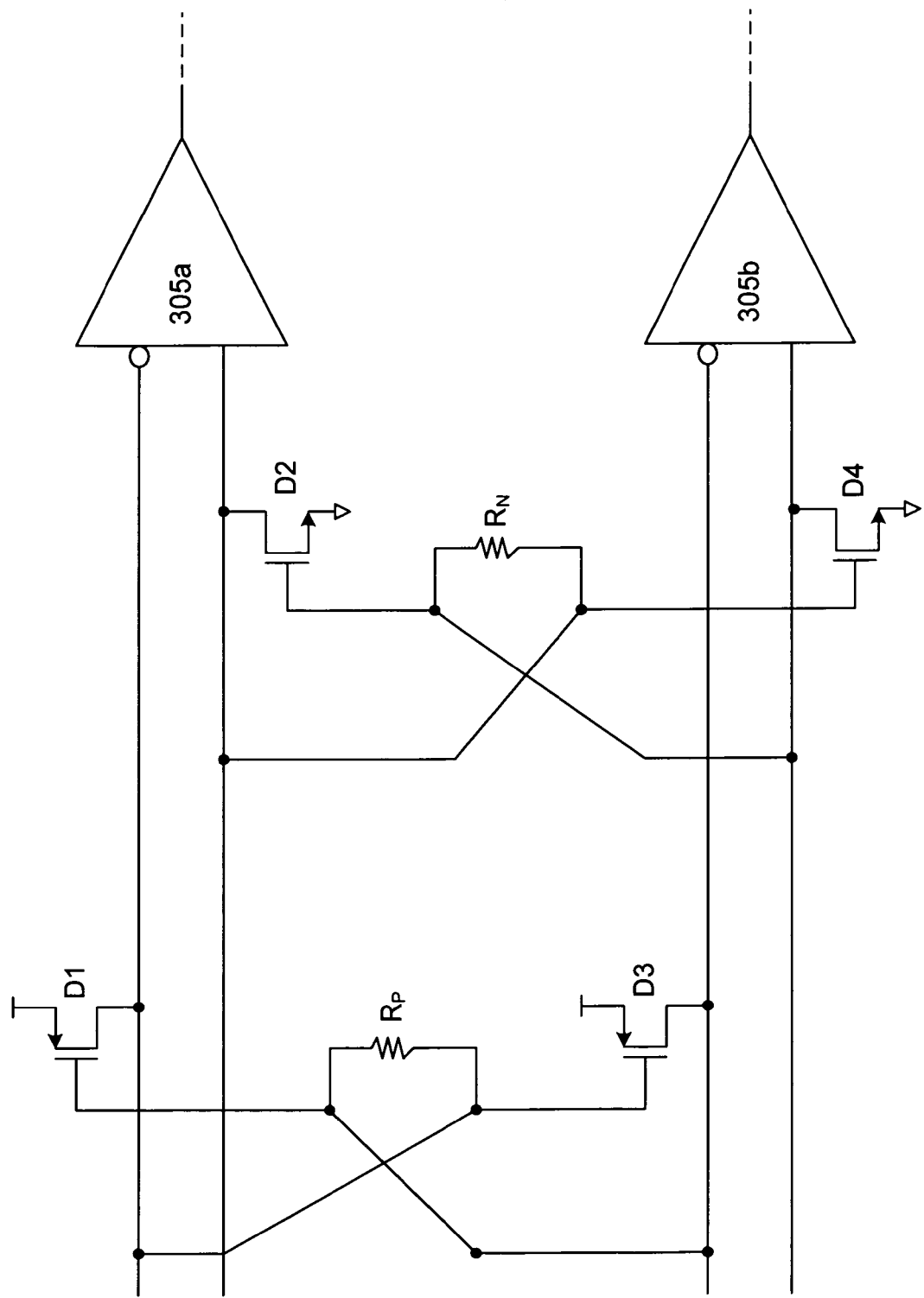
FIG. 5 is a schematic diagram of a portion of an amplifier in accordance with yet another embodiment of the present invention.

Referring now to FIG. 5, shown is a schematic diagram of another embodiment of the present invention. More specifically, circuit 300 of FIG. 5 shows a plurality of pre-distortion diodes D1-D4 each coupled to an input line to a differential pair of complementary gain stages 305$_a$ and 305$_b$. These MOSFETs D1-D4 are also cross-coupled to corresponding input lines to the other differential gain stage. In this way, the DC behavior of the MOSFETs is that of a diode. By using such cross-coupled devices in a differential topology such as in FIG. 5, the devices can be reused to provide gain. In other words, the large-signal behavior of the cross-coupled devices has a non-linear compressive gain that pre-distorts the input voltage signals to the gain stages 305$_a$ and 305$_b$ in a similar fashion to a simple diode. In contrast, a simple diode cannot provide gain. Thus as shown in FIG. 5, device D1, which is a PMOS transistor has a drain terminal coupled to the input line to a PMOS device of gain stage 305$_a$ and a gate terminal cross-coupled to an input line to a PMOS device of gain stage 305$_b$. Similarly, device D3 is a PMOS transistor having a drain terminal coupled to the input line to a PMOS device of gain stage 305$_b$ and a gate terminal cross-coupled to an input line to the input line to the PMOS device of gain stage 305$_a$. In the embodiment of FIG. 5, the source terminals of D1 and D3 may be tied, e.g., to a supply voltage. Note that a shunt resistance, $R_p$, may be coupled between cross-coupled devices D1 and D3. More specifically, this resistance is coupled in parallel between the gate terminal of device D1 and the first input line to gain stage 305$_b$, and a gate terminal of device D3 and the first input line to gain stage 305$_a$. Another shunt resistance, $R_n$, is similarly cross-coupled in shunt across cross-coupled devices D2 and D4, which are connected in similar fashion as devices D1 and D3.

In a differential implementation, using cross-coupled pairs of devices may provide the same linearization benefits, but provide gain in the form of a negative shunt resistance. This improves linearity by providing pre-distortion, and increases gain. To maintain stability under all conditions, this resistor can be coupled in shunt across the cross-coupled devices. This allows the diode devices to be sized independently of stability considerations. That is, the cross-coupling creates positive feedback and thus a gain realizing a negative equivalent resistance in shunt across the input to the gain devices. Because of this negative resistance, which could oscillate, the shunt resistances are added to ensure a net positive resistance, still generating some gain out of the pre-distortion diodes while preserving stability. Note that the configuration of FIG. 5 can be implemented in transformer or AC coupled configurations shown above in FIGS. 3 and 4, respectively. The negative resistance can be used to partially or completely cancel losses associated with any input network, such as lossy inductors or transformers. This approach uses the diode bias current to increase gain and effective Q, as well as improve linearity. Note that diode sizing and matching considerations may be same as described above in regard to FIGS. 3 and 4.

The linearity of a diode pre-distortion circuit can be improved in some embodiments. This pre-distortion technique can also be thought of as a current mirror, in which the diode pre-distorts the input voltage to a gain stage with the inverse distortion of the output transconductor (i.e., the output gain device) such that the output current, $I_{out}$, is a faithful (linear) reproduction of the input circuit, $I_{in}$. However, any current lost from the drain node of the diode device due to $Y_x$ or any filtering of the gate voltage ($V_g$) to the output device (which would partially destroy the pre-distortion of this voltage) can re-introduce non-linearity into the $I_{out}/I_{in}$ transfer function. Thus, this non-ideality, e.g., $Y_x$ as shown in FIG. 2A causes an error current $I_{error}$, which causes an incorrect pre-distorted gate voltage to be generated. This error current $I_{error}$ can be caused by various mechanisms: resistive leakage from lossy matching elements; output impedance from the driver stage; capacitance ($C_{gs}$) of the output device; change in capacitance of the output device (after $C_{gs}$ is resonated by an inductor L at the gate); and the total of gate and drain capacitance of the diode.

Figure 6A:
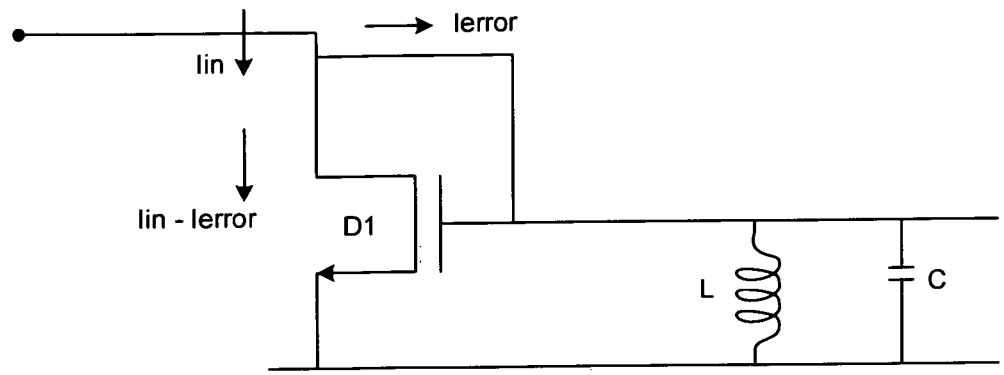
FIG. 6A is a schematic diagram of a pre-distortion device having an error current.

As shown in FIG. 6A, the device for diode pre-distortion has a leakage current, shown as $I_{error}$. This error current error is diverted from the input current, $I_{in}$, and only the difference ($I_{in}$-$I_{err}$) is appropriately pre-distorted by diode D1 in the generation of the gate voltage. To overcome this problem, a corresponding error current may be generated and provided, without it being diverted from the input current. Note that in FIG. 6A, the gate terminal of diode D1 is coupled to a gate terminal of a transconductance amplifier of a gain stage (not shown for ease of illustration in FIG. 6A). As further shown in FIG. 6A, an inductance L and a capacitance C, which may be comprised of parasitic capacitance or gate or drain capacitance, may also be connected in shunt to the common gate terminals. Note that this inductance L is present in the circuit of FIG. 6A, which is for use at wireless frequencies, i.e., RF frequencies of a given wireless communication system. Thus inductance L resonates out this capacitance. Also note that the inductor L will have a DC block (perhaps a large valued series capacitor) to enable appropriate biasing of the diode and the gain device. Further, note that inductor L may be connected differentially, or may be part of an inductor already present in another part of circuit, for example, the inductor $L_{MI}$ present in FIG. 4A.

Figure 6B:
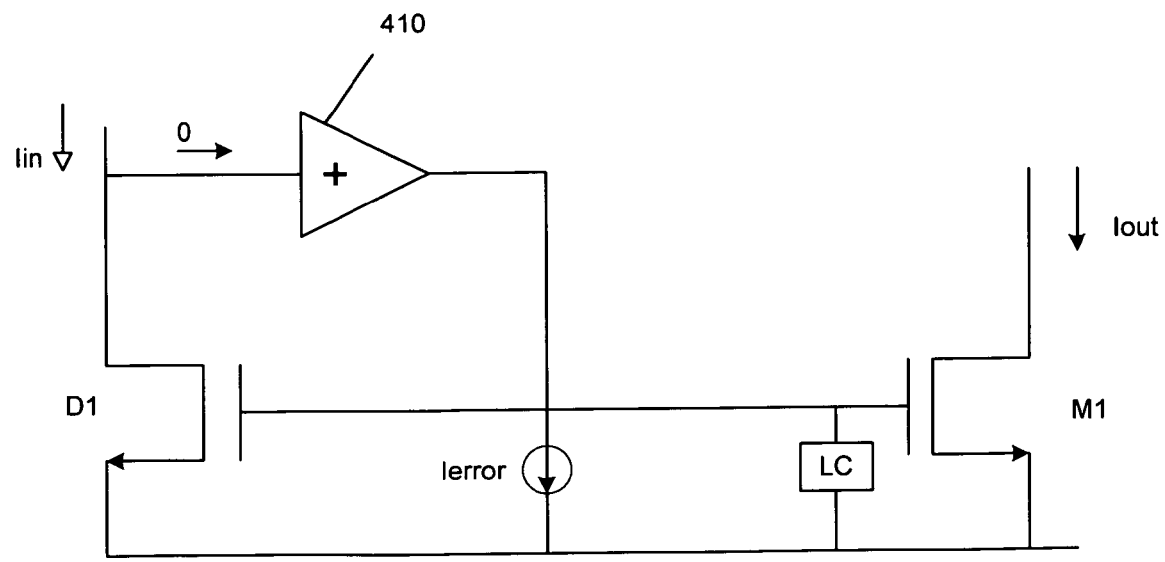
FIG. 6B is a conceptual schematic diagram of a helper circuit in accordance with an embodiment of the present invention.

A class of circuits, which may be referred to as "helper" circuits may be provided to improve linearization of the diode pre-distortion technique. Referring now to FIG. 6B, shown is a conceptual schematic diagram of a helper circuit in accordance with an embodiment of the present invention that can be used to supply $I_{error}$ and improve linearity of the diode pre-distortion technique. As shown in FIG. 6B, circuit 400 includes a helper circuit 410, which is shown as a generic amplifier that may have an input coupled to the drain terminal of diode D1 and an output coupled to the common gate terminals of diode D1 and gain device M1. Note that helper circuit 410 thus may actually form part of a composite diode as it is connected in the feedback path between gate terminal and drain terminal of the NMOS device D1. For ease of notation, the device D1 configured in this feedback circuit will be called a diode device. In this way, any current consumed by parasitics at the common gate terminal can be provided by helper circuit 410, e.g., in the form of the amplifier shown in FIG. 6B from input to output of diode D1 to thus prevent consumption of the input current into such parasitics. This helper circuit 410 may minimize current loss by preventing loss of current from the input to diode D1 and by supplying the necessary error current to parasitics of the circuit.

As further shown in FIG. 6B, a resonant circuit LC may be connected in shunt with the common gate terminals where an inductor is connected in parallel with a capacitor. Specifically, while shown as a circuit LC, understand that this circuit may be formed of an intentional inductance L (with a series capacitor, not shown), either present as shown in FIG. 6B or elsewhere connected within circuit 400, while the capacitance C may correspond to various intentional and parasitic capacitances at the RF frequency at which circuit 400 operates. Further, it is clear that the circuits could be reconfigured with a series connection of an inductor and capacitor if desired.

As will be described in particular embodiments below, this helper circuit can be implemented in a variety of forms. An optimal implementation for a given embodiment may be created to operate at a desired RF frequency and can be easily implemented (without adding too much complexity), without consuming excessive current (which will detract from achieving high efficiency operation). Understand that the simplified circuit 400 shown in FIG. 6B is only a partial view of a signal path and it is understood that various other components, including, for example, a DC block may be provided at an input to circuit 400.

Figure 7:
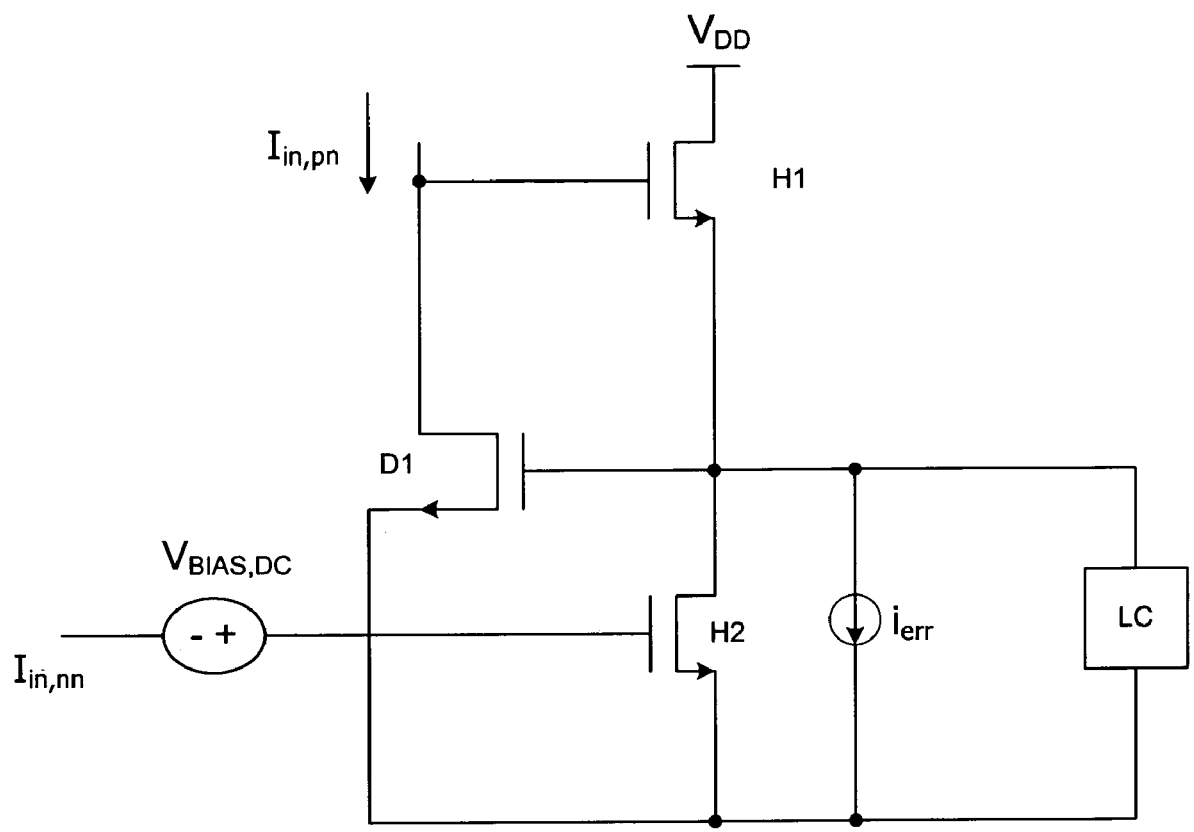
FIG. 7 is a schematic diagram of a helper circuit in accordance with one embodiment of the present invention.

Referring now to FIG. 7, shown is one embodiment of a helper circuit. As shown in FIG. 7, circuit 500 includes a pair of helper devices H1 and H2. NMOS H1 has a gate terminal coupled to a drain terminal of diode D1, a drain terminal coupled to a supply voltage, $V_{DD}$, and a source terminal coupled to the common gate terminals of the diode D1 and the gain device (not shown in FIG. 7), along with a resonant circuit LC which may be formed as described above. This top helper device H1 may work well as long as the error current is small and flowing from the common gate terminal to the reference terminal (aka ground) as indicated in the figure. This is often the case in typical helper applications, such as in low-frequency bipolar current mirrors where the base current is an error current. However, in AC applications, the input current is a time-varying signal, and thus the error current will also vary with time and can flow in either direction at any given instant. That is, device H1 can only source current into the common gate terminal. To provide the ability to sink current, a second NMOS device H2 may have a drain terminal coupled to the common gate terminals of the diode device and gain device, a source terminal coupled to ground, and a gate terminal to receive a bias voltage and an inverted form of the input signal. In an embodiment in which a differential implementation is present, this signal may be received from any terminal that is inverted with respect to the common gate terminal. For example, the signal can be derived from the opposite (inverted) driver output terminal, or from the gate terminal from the opposite output device, as will be shown below with respect to FIG. 9. Note that while shown as having current inputs, in actual implementation, these inputs can be capacitively or inductively coupled to a previous driver stage. Note that the bias voltage for NMOS H2 acts to shift the input of H2 to be sufficiently above the threshold voltage ($V_{tn}$). In one embodiment, this bias voltage can be implemented as a capacitor with a resistor providing the appropriate DC bias. Note that inductor L may be connected differentially, or may be part of an inductor already present in another part of circuit, for example, the inductor present in FIG. 4A. Further, note that if the inductor L is not implemented differentially, it would need a DC block (perhaps a high-valued series capacitor) in addition, to enable appropriate biasing of the diode and gain devices.

Figure 8A:
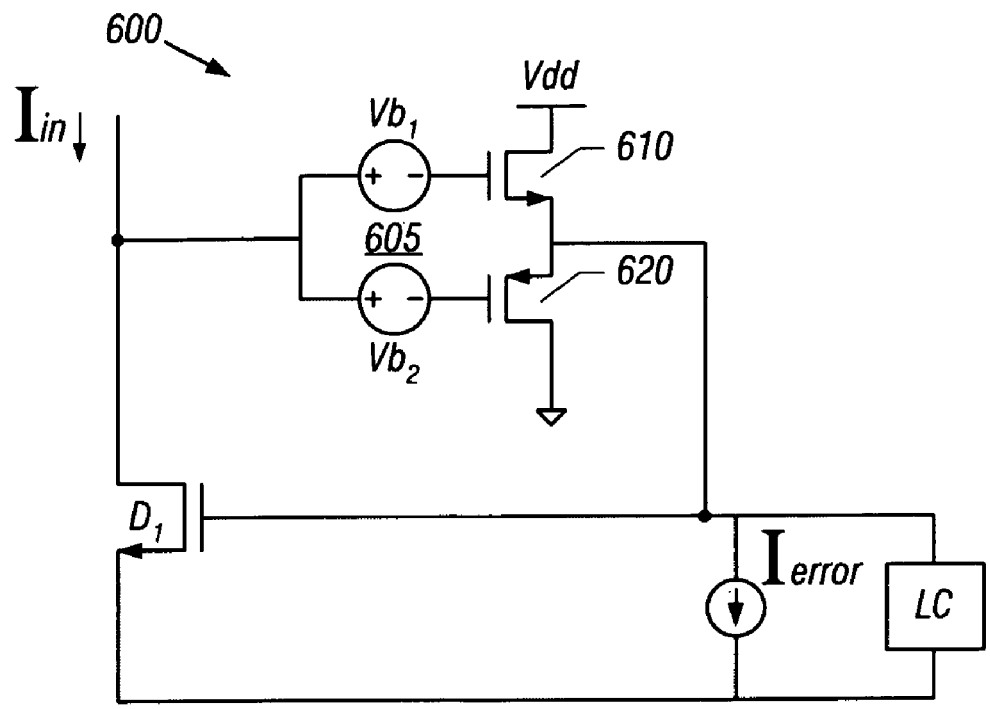
FIG. 8A is a schematic diagram of a helper circuit in accordance with another embodiment of the present invention.

Yet another way to implement a helper circuit that gives the ability to source or sink current is a push-pull Class B (or AB) circuit. Referring now to FIG. 8A, shown is a general form of such a helper circuit to provide the ability to source or sink current in a circuit 600. As shown in FIG. 8A, a helper circuit 605 formed of an NMOS device 610 coupled to a PMOS device 620 can be coupled between drain and gate terminals of the pre-distortion device D1. Note that each device has commonly coupled source terminals coupled to the common gate terminals of the diode device and gain device (which is not itself shown in FIG. 8A), to which is also coupled a resonant circuit LC, as described above. In turn, the gate terminal of each of the devices 610 and 620 may be coupled to a bias voltage (respectively $V_{B1}$ and $V_{B2}$), which in turn is coupled to the drain terminal of the diode device. In one embodiment, these DC bias voltages may be implemented with capacitors and an appropriate bias voltage could be resistively coupled to the gates of the devices 610 and 620.

Figure 8B:
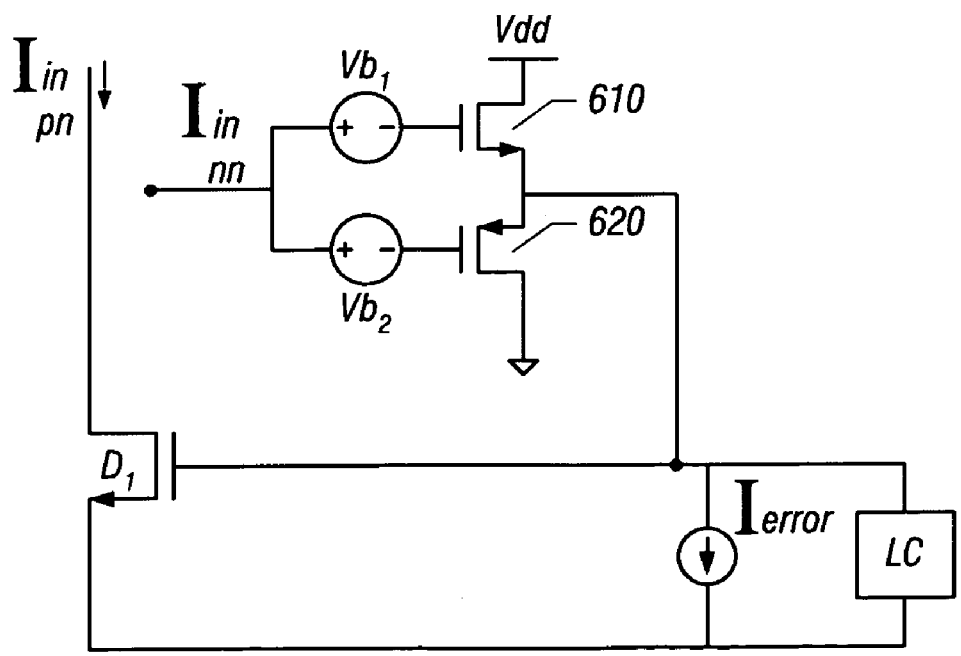
FIG. 8B is another schematic diagram of a helper circuit in accordance with another embodiment of the present invention

Instead of a complementary push-pull stage, a Class B or AB complementary common-source stage (inverter) can also be used. As shown in FIG. 8B, MOSFETs 610 and 620 can be implemented as an inverter, which provides a 180° phase shift. In this embodiment, device 610 is implemented as a PMOS and device 620 is implemented as an NMOS. In this circuit, the inverter input may be coupled to the other side of a differential driver stage (such as described above and shown below with regard to FIG. 9), thereby getting another 180° phase shift, at least for the differential signal. For the common-mode signal, however, a phase shift of 180° still exists. This could potentially cause instability (as the total phase shift through the helper and diode would be 360°). However, various manners exist to address the common mode instability. Note that in the embodiment of FIG. 8B, MOSFETs 610 and 620 may be biased by voltages $V_{b1}$ and $V_{b2}$, which may be provided by the bias sources shown in FIG. 8B. However, in other implementations, the need for such bias sources can be avoided, and instead these devices may be directly driven by the incoming current signal from the other side of the differential driver stage as described above, and shown below in the embodiment of FIG. 9.

Figure 9:
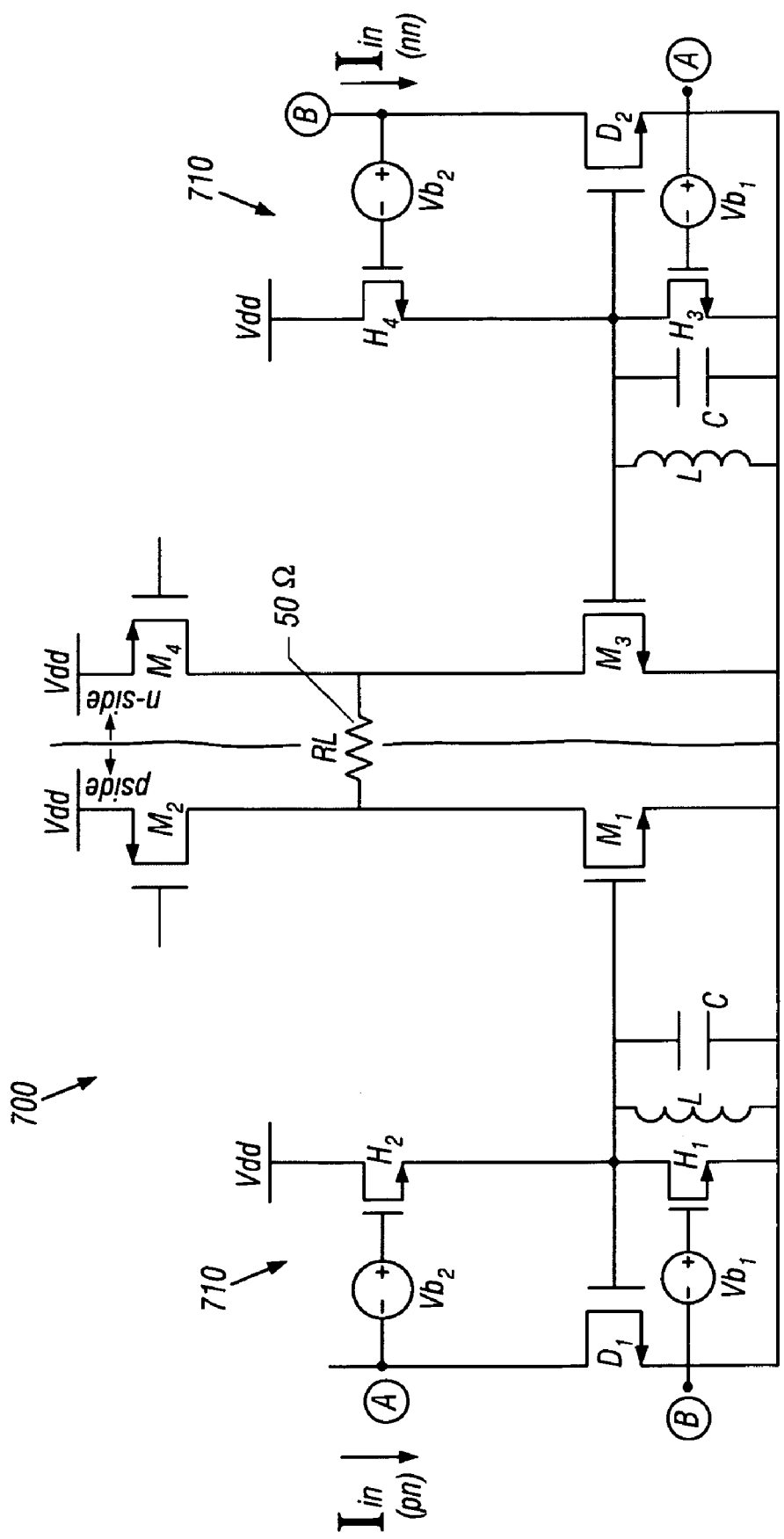
FIG. 9 is a differential embodiment of a gain stage including helper circuitry in accordance with an embodiment of the present invention.

Referring now to FIG. 9, shown is a differential embodiment of a gain stage including helper circuitry in accordance with an embodiment of the present invention. As shown in FIG. 9, circuit 700 includes differential gain stages, namely a p-side and an n-side, each formed of a pair of complementary MOSFETs M1 and M2, and MOSFETs M3 and M4, respectively. The output terminals of each differential portion of the gain stage is coupled to a load impedance, e.g., 50 ohms (Ω).

To provide diode pre-distortion and improved linearization of such distortion, embodiments may provide for a pre-distortion diode and a helper circuit therewith. Note that the implementation shown in FIG. 9 includes the diode pre-distortion and helper circuitry for the NMOSFETs M1 and M3. Similar but dual circuitry is present for the PMOS devices M2 and M4, but is not shown in FIG. 9 for ease of illustration. Thus, with reference to M1, its gate terminal has a pre-distortion diode D1 coupled thereto. To provide for improved linear performance, a helper circuit 710 formed of a pair of NMOS devices H1 and H2 is present, as shown in FIG. 9. This helper circuit 710 may correspond to that shown in FIG. 7. That is, FIG. 7 can be thought of as a helper core, and similar instantiations can be coupled to each transconductance amplifier of the gain stages of circuit 700. In other implementations, instead of the helper core of FIG. 7, helper cores adapted such as those in FIG. 8A or 8B can instead be coupled to each of the transconductance amplifiers.

As shown in FIG. 9, helper devices H1 and H2 may be biased with a respective bias voltage $V_{b1}$ and $V_{b2}$, each of which may be coupled to nodes of the other side of the circuitry (i.e., the n-side). Thus with reference to the bias voltages for NMOS devices H1 and H2, such voltages may be obtained from the nodes present in n-side of circuit 700. A similar helper circuit 710 is present and coupled to NMOS M3, and includes NMOS devices H3 and H4. Note that while not shown for ease of illustration in the embodiment of FIG. 9, understand that the incoming currents $I_{in}$ (pn) and $I_{in}$ (nn) may be received from driver stages, e.g., through a transformer or capacitive-based coupling, in some implementations. As further shown in FIG. 9, connected in shunt with the common gate terminals of a transconductance amplifier and its pre-distortion diode is an inductor L and a capacitance $C_P$, which may be a parasitic capacitance that is tuned out using inductor L. Prior comments about the biasing with the inductor L are applicable here as well.

Figure 10A:
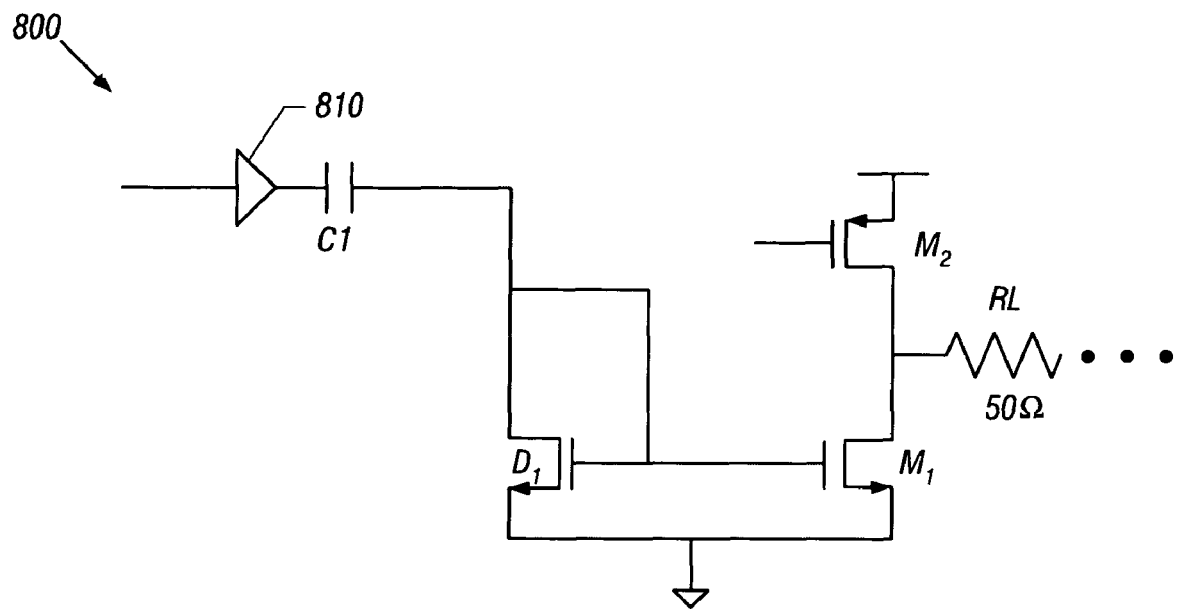
FIG. 10A is a model of a driver stage coupled to an input of a gain stage having diode pre-distortion.
Figure 10B:
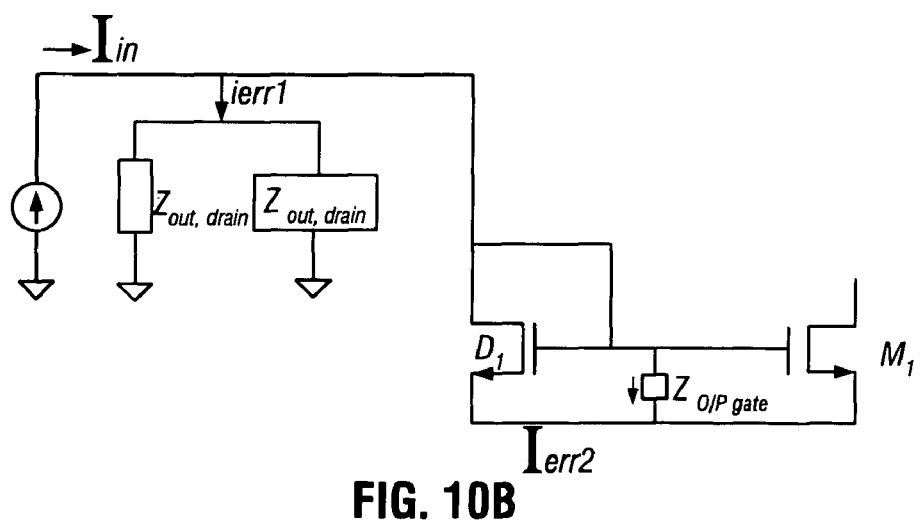
FIG. 10B is another model of a driver stage coupled to an input of a gain stage having diode pre-distortion.

While helper circuits such as set forth above can provide improved linearization by compensating for any error currents at the gates of the diode and gain device, additional considerations of a circuit in which a helper circuit is to be included may lead to identification of additional potential error currents, due to parasitics present in a driver stage coupled to a gain stage, or even the parasitic of the drain of the MOS transistor configured as the diode. Referring now to FIG. 10A, shown is a model of a driver stage coupled to an input of a gain stage having diode pre-distortion. Specifically, as shown in FIG. 10A, circuit 800 includes a driver stage 810 capacitively coupled through a capacitor C1 to the gate terminal of an output NMOS device M1, which has a pre-distortion diode D1 connected in shunt therewith. Note that the pre-distortion diode for the NMOS device is shown; a complementary path of course exists for the PMOS device M2 of the gain device. This driver stage 810 and capacitance C1 has its own parasitics. Specifically, the circuit 800 of FIG. 10A can be modeled with the impedances shown in FIG. 10B. Thus the driver stage is modeled with output impedances for the driver and the drain terminal of diode D1 (including the output resistance of D1), namely $Z_{out,\ driver}$ in parallel with $Z_{diode,\ drain}$. Still further, an impedance of the gate of NMOS device M1 may be modeled as $Z_{o/p\ gate}$. Note that the drain and gate capacitance of D1 can be apportioned between these impedances, or lumped into either. Thus as shown, two error currents exist, namely $I_{err1}$ due to the driver and diode drain parasitics, and $I_{err2}$ due to diode/output device gate parasitics. Both of these error currents subtract current from the input current that generates the pre-distorted gate voltage resulting in (a partially) incorrect generation of the pre-distorted gate voltage.

To have the gate voltage track the input more faithfully, these two sources of error current should be made as small as possible relative to the input current. One way to accomplish that is to make the resistance (1/gm) of the diode much smaller than the other impedances that occur in parallel. The transconductance of the diode can be increased in various manners. One manner of increasing the transconductance is to scale up the size of the diode device and/or scale up the input current to the diode device. However, such efforts may lead to less gain in the output stage, in turn raising the need to increase the size of the driver stage. Such efforts may lead to lower total efficiency. Some of the parasitics may also proportionally scale with the diode/driver, and hence making this method not as effective. Thus, other manners of increasing the transconductance may be implemented.

Figure 10C:
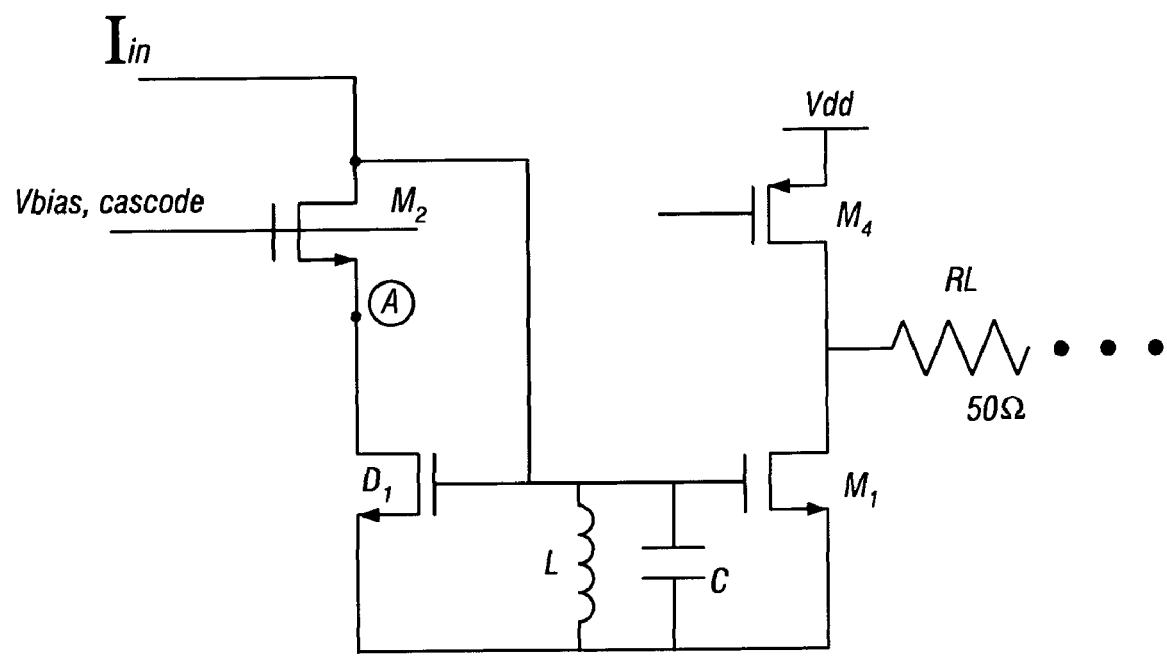
FIG. 10C is a schematic diagram of a cascode helper circuit in accordance with one embodiment of the present invention.

For example, in one embodiment, the transconductance can be increased to realize lower impedance by providing a cascode to the diode. Without a cascode, $Z_{in,diode}$=1/gm, approximately. Referring now to FIG. 10C, shown is a schematic diagram of a cascode helper circuit in accordance with one embodiment of the present invention. As shown in FIG. 10C, a cascode device M2 is provided in the input signal path to pre-distortion diode D1. As shown in FIG. 10C, cascode device M2 may be an NMOS having a drain terminal coupled to a signal path (e.g., from a driver stage or other location), a gate terminal driven by a bias voltage, $V_{bias}$, cascode, and a source terminal coupled to a drain terminal of pre-distortion diode D1 at a node A. Note that in addition to output device M1, a complementary output device M4 is present. Further, while not shown for ease of illustration, M4 may also be compensated with a pre-distortion device and cascode device. As also shown in FIG. 10C, a resonant circuit including an inductor L and a capacitance C is coupled in shunt with the common gate terminals of output device M1 and pre-distortion diode D1. As described above, the capacitance may represent parasitic capacitances present at an RF frequency of operation. Also note prior comments about the implementation of the inductor L.

Thus, rather than being in a feedback path of the pre-distortion diode as in other helper circuits discussed above, cascode device M2 is present in the signal path and acts as an amplifier to increase the loop gain in the signal path, thus reducing the impedance presented by the diode in the signal path. As such, the impedance looking into the diode is lowered further by the "self-gain" (or loop gain) of the cascode device M2, and thus $Z_{in,\ diode} \approx 1/\text{gm}\ 1/\text{gm} \cdot r_o$. If, at RF frequency, this denominator, gm·$r_o$ of the cascode is approximately equal to 10, for example, then the $I_{error}$ currents can be reduced approximately by a factor of 10. Cascoding also reduces voltage variations of node A at the drain terminal of the diode device, thereby making any drain-to-bulk capacitance (of the diode) less significant. Note that the cascode bias source may be set such that pre-distortion diode D1 remains in a saturation region during normal operation. Cascode device M2 thus passes the input current $I_{in}$ to its output terminal. Note that this output current from cascode device M2 may be considered to be a copy of the input current $I_{in}$, although it may have some variation due to error currents or parasitics.

As described above, diode pre-distortion as implemented in a gain stage, with or without the helper circuits, may have tuned circuits at the fundamental frequency. The tuned (resonant) circuit is a practical way to significantly reduce the shunt reactive elements, such as $C_{gs}$, that would otherwise act as a source of error in the pre-distortion. This approach works well to linearize the transfer function of the fundamental tone. However, there is typically excess energy in the harmonics at the output.

The high harmonic level can be explained by considering an ideal diode pre-distortion circuit where there are no device capacitances or driver output conductance. In this case, a single input tone is pre-distorted by the diode. The voltage waveform at the diode/gate thus has some significant energy in the harmonics. As these multiple tones are processed by the non-linear transconductance of the output device, they combine in such a way as to generate a single tone at the fundamental frequency at the output. When a resonant tank is added in shunt with the diode, tuned to the fundamental, which has significant attenuation at all harmonics, the harmonics of the voltage waveform at the gate of the output device are reduced, nearly to that of a single tone. At a narrow band at which a power amplifier is to operate (i.e., a small bandwidth with regard to carrier frequency), such a substantially single tone output may have acceptable linearity. However, the combining in the non-linear transconductance does not result in a complete cancellation of the harmonics at the output. Hence, the harmonics can be higher than that of the ideal linear stage.

The higher harmonics can be addressed by summing parallel paths, each tuned at the fundamental frequency or a harmonic thereto. The principle behind this approach is that of a power series expansion of a weakly non-linear transfer function. Under these conditions, the function acting on a sum of signals can be approximated by the sum of the function each acting on a single tone signal (each perhaps at different frequencies).

Figure 11:
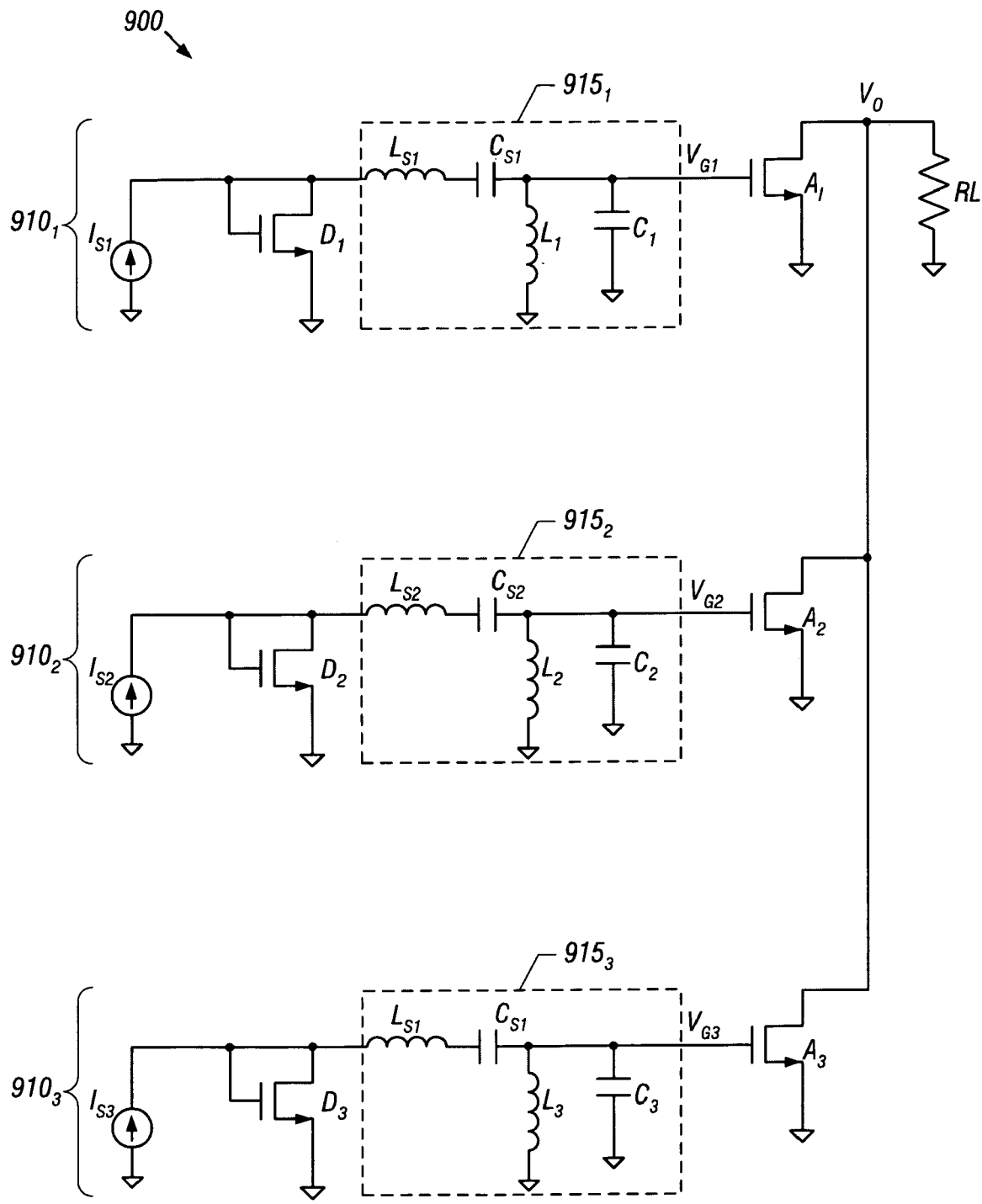
FIG. 11 is a schematic diagram of an output stage having diode pre-distortion in accordance with yet another embodiment of the present invention

Referring now to FIG. 11, shown is a schematic diagram of an output stage having diode pre-distortion in accordance with yet another embodiment of the present invention. As shown in FIG. 11, circuit 900 includes a plurality of parallel gain paths $910_1$-$910_3$, each of which has a pre-distortion diode $D_x$ in shunt with a gain device $A_x$. Still further, there is a filter circuit $915_1$-$915_3$ each including a series $L_{sx}$ and $C_{sx}$ followed by an inductance $L_x$ connected in shunt with a capacitance $C_x$. These series LC and the shunt LC of the filter are tuned to the same frequency that is appropriate for that path. Prior comments about the biasing with the shunt resonating inductance $L_x$ apply here. Note that there are many alternate embodiments for these filter circuits. As shown in FIG. 11, each gain path 910 (generically) receives an input current $I_{sx}$ and provides a gate voltage $V_{gx}$ to its corresponding gain device $A_x$, the outputs of which are coupled to and summed at an output node, which thus provides an output voltage $V_o$ at a load $R_L$. Alternatively, the filters can be driven from a single current source and a diode in parallel.

First path $910_1$ may be a main path that thus provides a gate voltage $V_{g1}$ at the fundamental frequency (i.e., $f_0$). In turn, second gain path $A_2$ may have filter $915_2$ tuned to a second harmonic of the fundamental frequency (i.e., $2f_0$) to thus provide a gate voltage of $V_{g2}$. In turn third gain path $A_3$ may have filter $915_3$ tuned to a third harmonic of the fundamental frequency (i.e., $3f_0$) to thus provide a gate voltage of $V_{g3}$. Note that the relative device sizes (A1, A2, A3 . . . ) can be used to set coefficients of a series expansion. The phase shift through each filter should be considered in proper design of each path.

In one embodiment, the relative size of the gain stages (e.g., ratios of areas A1/A2, etc.) may be developed using Taylor series coefficients. As one example, the third gain stage may be 10 times smaller than the first gain stage. Diodes will scale areas also, and capacitances will scale with areas. The inductors may be set by the frequency of path and capacitance (device area). While shown with three such stages in the embodiment of FIG. 11, the scope of the present invention is not limited in this regard and more or fewer such stages may be present in different embodiments.

FIG. 11 further shows the individual gate voltages of each gain path. The majority of the energy of $V_{g1}$ is present at the fundamental frequency, with very small amounts of energy at various harmonics. In turn, for $V_{g2}$, the majority of the energy is at the second harmonic, while for $V_{g3}$ the majority of the energy is at the third harmonic. Thus when summed at the output node, the output voltage, $V_o$ is a substantially linear signal with minimal harmonic noise.

Note that for ease of illustration, a single-ended amplifier is shown in FIG. 11. However, embodiments may be implemented differentially. In a differential implementation, even harmonics may be significantly suppressed by the differential stage. Thus, there may be no need to provide a parallel stage to cancel a second harmonic (for example). Thus the most relevant harmonic is the third harmonic which may be suppressed with a parallel stage. In some implementations, especially in a differential implementation, this single parallel stage may be the only needed harmonic compensation stage. Additional parallel stages may not be provided, as other odd harmonics (e.g., fifth, seventh, and higher) may be much smaller.

Still further, complementary embodiments may be provided. In such cases, dual paths to that shown in FIG. 11 may be provided for a corresponding plurality of PMOS devices, with PMOS pre-distortion diodes and gain devices, coupled in similar fashion to that of FIG. 11 (i.e., with drain terminals of the gain devices coupled to sum an output voltage).

Figure 12:
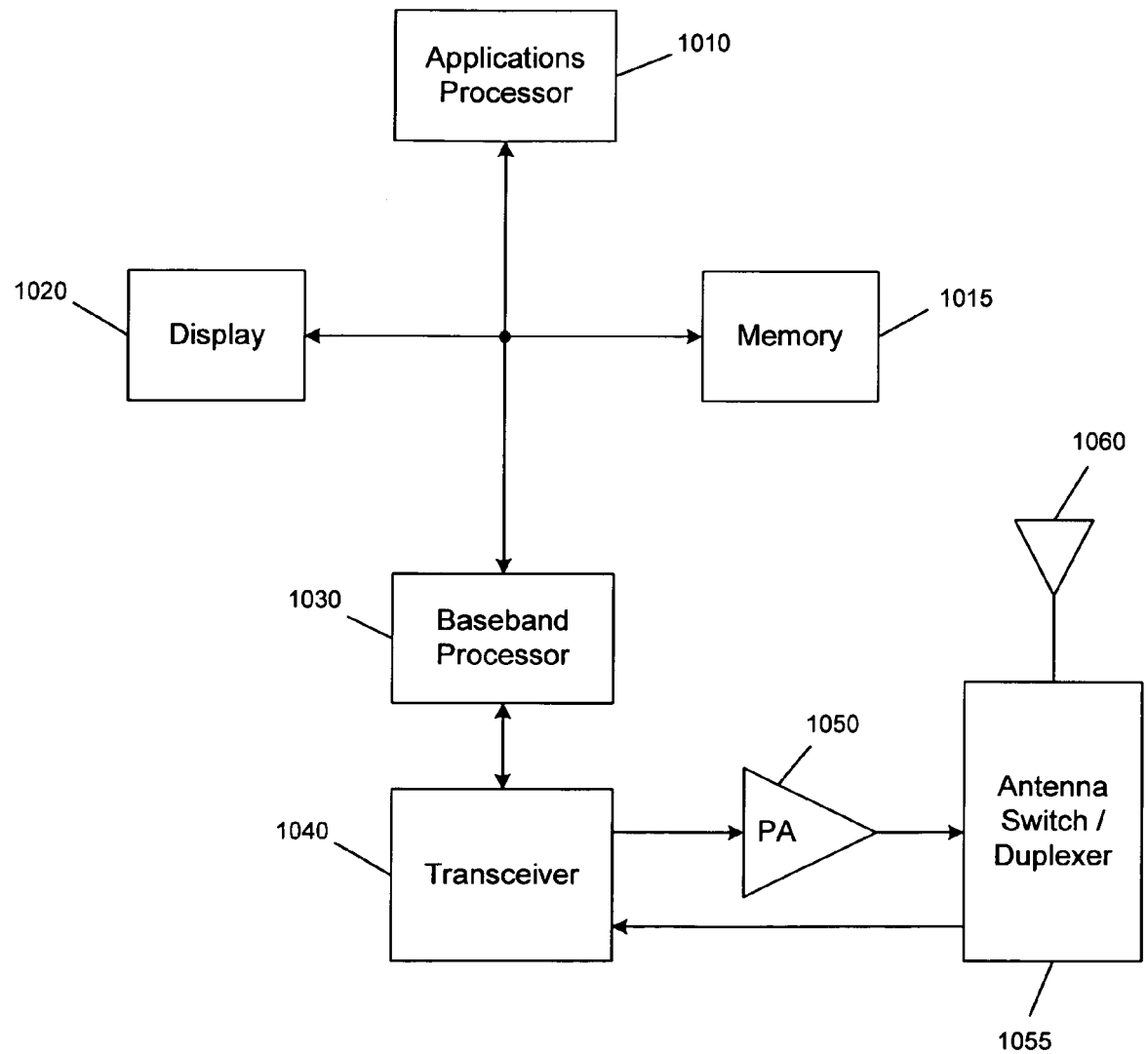
FIG. 12 is a block diagram of a wireless device in accordance with an embodiment of the present invention.

As described above, compensation circuitry in accordance with an embodiment of the present invention can be implemented in a PA such as a CMOS PA. Such a device can be used in various wireless systems, including handsets, mobile devices, PDAs and so forth. Referring now to FIG. 12, shown is a block diagram of a wireless device 1000 in accordance with an embodiment of the present invention. As shown in FIG. 12, wireless device 1000 may include an applications processor 1010 which may be a microprocessor or other programmable logic to handle various system features, such as running application programs desired by a user. To perform its functions, applications processor 1010 may communicate with a memory 1015, which may be a flash memory or other non-volatile memory. Applications processor 1010 may further communicate with a display 1020, such as an LCD display of the system. For handling RF communications, e.g., wireless phone calls, wireless data transmissions and so forth, e.g., according to a communications protocol such as EDGE or W-CDMA, applications processor 1010 may communicate with a baseband processor 1030, which may handle baseband operations both for transmit and receive paths. In turn, baseband processor 1030 is coupled to a transceiver 1040, which may receive incoming baseband signals from baseband processor 1030, and perform processing to upconvert the signals to RF levels for transmission to a PA 1050. PA 1050 may be a power amplifier in accordance with an embodiment of the present invention that includes one or more gain stages having capacitor compensation circuitry as described above. In turn, PA 1050 may be coupled to an antenna switch, duplexer or both 1055 which in turn is coupled to an antenna 1060, which radiates the amplified RF signal.

In a receive path, antenna 1060 couples through antenna switch 1055 and possibly through the duplexer or SAW filters and then to transceiver 1040, which may demodulate the incoming RF signals back to baseband for transmission to baseband processor 1030 for further processing. While shown with this particular implementation in the embodiment of FIG. 12, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a diode device to receive an incoming radio frequency (RF) signal to be amplified in a gain device of an amplifier and to provide a pre-distorted signal;
the gain device to receive the pre-distorted signal and to output an amplified RF signal, wherein the diode device is to pre-distort the incoming signal with a substantially inverse distortion of a non-linearity of the gain device such that the amplified RF signal is a substantially linear version of the incoming RF signal; and
a second diode device to receive the incoming RF signal and to provide a second pre-distorted signal to a second gain device, wherein the second diode device and the second gain device are connected to a supply voltage, and wherein the gain device and the second gain device form a complementary gain stage, and the diode device is coupled between a reference voltage and a gate terminal of the gain device and the second diode device is coupled between the supply voltage and a gate terminal of the second gain device.

2. The apparatus of claim 1, wherein the diode device is forward biased, and is coupled in shunt with an input terminal of the gain device.

3. The apparatus of claim 1, wherein the diode device is a diode-connected transistor having a common polarity with a transistor corresponding to the gain device, and is to provide a gate voltage corresponding to the pre-distorted signal.

4. The apparatus of claim 3, further comprising an inductor to resonate a capacitance at a frequency of the incoming RF signal.

5. The apparatus of claim 4, further comprising means for reducing harmonics at an output of the gain device, wherein the harmonics are caused by filtering of the incoming RF signal by the inductor.

6. An apparatus comprising:
a diode device to receive an incoming radio frequency (RF) signal to be amplified in a gain device of an amplifier and to provide a pre-distorted signal;
the gain device to receive the pre-distorted signal and to output an amplified RF signal, wherein the diode device is to pre-distort the incoming signal with a substantially inverse distortion of a non-linearity of the gain device such that the amplified RF signal is a substantially linear version of the incoming RF signal; and
a helper circuit coupled to the diode device to control the pre-distorted signal at a common terminal of the diode device and the gain device, wherein the diode device comprises a transistor having a gate terminal coupled to a gate terminal of the gain device, and an output terminal coupled to an input of the helper circuit and an output of the helper circuit coupled to the gate terminals.

7. A power amplifier comprising:
a first driver stage to receive a radio frequency (RF) signal and provide a first RF driver signal;
a second driver stage to receive the RF signal and provide a second RF driver signal;
a first complementary pair of diode devices coupled to at least one of the first and second driver stages to pre-distort the first and second RF driver signals into a first pair of pre-distortion signals to compensate for non-linearity of a first gain stage;
the first gain stage including a complementary amplifier to receive the first pair of pre-distortion signals and to output a first amplified RF signal;
a second complementary pair of diode devices coupled to at least one of the first and second driver stages to pre-distort the first and second RF driver signals into a second pair of pre-distortion signals to compensate for non-linearity of a second gain stage; and
the second gain stage including a complementary amplifier to receive the second pair of pre-distortion signals and to output a second amplified RF signal.

8. The power amplifier of claim 7, further comprising a transformer coupled between the first and second driver stages and the first and second complementary pairs of diode devices, the transformer having a first secondary coil coupled to a first diode device of the first and second complementary pairs of diode devices and a second secondary coil coupled to a second diode device of the first and second complementary pairs of diode devices, wherein the transformer is to at least partially resonate with a capacitance of the first and second driver stages and parasitic capacitances of the first and second complementary pairs of diode devices and the first and second gain stages.

9. The power amplifier of claim 7, wherein the first and second gain stages and the first and second complementary pairs of diode devices form a first parallel signal path, and further comprising a second parallel signal path including third and fourth gain stages and third and fourth complementary pairs of diode devices, wherein the second parallel signal path is switchably coupled to the first and second driver stages.

10. The power amplifier of claim 7, further comprising:
an inductance coupled in parallel between outputs of the first and second driver stages; and
coupling capacitors to serially couple the corresponding first and second RF driver signals to the first and second gain stages.

11. The power amplifier of claim 7, wherein the first complementary pair of diode devices are cross-coupled to the input of the second gain stage, and the second complementary pair of diode devices are cross-coupled to the input of the first gain stage.

12. The power amplifier of claim 11, further comprising:
a first resistance coupled in shunt between a first diode device of the first and second complementary pairs of diode devices; and
a second resistance coupled in shunt between a second diode device of the first and second complementary pairs of diode devices.

13. A power amplifier comprising:
a first parallel gain stage to receive a first input current on a first input signal line and to generate a first amplified output current, the first parallel gain stage including a first pre-distortion device coupled to the first input signal line to generate a pre-distortion voltage, a first filter coupled to the first pre-distortion device and tuned to a fundamental frequency, and a first gain device driven by the pre-distortion voltage and to generate the first amplified output current; and
a second parallel gain stage to receive a second input current on a second input signal line and to generate a second amplified output current, the second parallel gain stage including a second pre-distortion device coupled to the second input signal line to generate a second pre-distortion voltage, a second filter coupled to the second pre-distortion device and tuned to a harmonic of the fundamental frequency, and a second gain device driven by the second pre-distortion voltage and to generate the second amplified output current, wherein the first amplified output current and the second amplified output current are provided to a load to generate an amplified voltage, and wherein the second parallel gain stage is to reduce at least one harmonic generated in the first parallel gain stage.

14. The power amplifier of claim 13, wherein an output current formed of the first amplified output current and the second amplified output current is a substantially linear version of an input current formed of the first input current and the second input current.

15. The power amplifier of claim 13, wherein the second parallel gain stage is sized with respect to the first parallel gain stage according to coefficients of a series expansion, and the first and second parallel gain stages are each differential gain stages, and wherein the second parallel gain stage is to substantially cancel a third harmonic of the fundamental frequency.

16. An apparatus comprising:
a diode device to receive an incoming radio frequency (RF) signal to be amplified in a gain device of an amplifier and to provide a pre-distorted signal, wherein the diode device is a diode-connected CMOS transistor having a common polarity with a CMOS transistor corresponding to the gain device; and
the gain device to receive the pre-distorted signal and to output an amplified RF signal, wherein the diode device is to pre-distort the incoming signal with a substantially inverse distortion of a non-linearity of the gain device such that the amplified RF signal is a substantially linear version of the incoming RF signal.

17. The apparatus of claim 16, further comprising a helper circuit coupled to the diode device to control the pre-distorted signal at a common terminal of the diode device and the gain device.

18. The apparatus of claim 16, further comprising means for reducing harmonics at an output of the gain device, wherein the harmonics are caused by filtering of the incoming RF signal by an inductor that resonates a capacitance at a frequency of the incoming RF signal.

* * * * *